United States Patent
Suh et al.

(10) Patent No.: US 7,907,448 B2
(45) Date of Patent: Mar. 15, 2011

(54) SCALED DOWN SELECT GATES OF NAND FLASH MEMORY CELL STRINGS AND METHOD OF FORMING SAME

(75) Inventors: YouSeok Suh, Cupertino, CA (US); Shenqing Fang, Fremont, CA (US); Kuo-Tung Chang, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 166 days.

(21) Appl. No.: 12/246,981

(22) Filed: Oct. 7, 2008

(65) Prior Publication Data

US 2010/0085811 A1 Apr. 8, 2010

(51) Int. Cl.
*G11C 16/04* (2006.01)

(52) U.S. Cl. ......... 365/185.17; 365/185.13; 365/185.26; 365/185.33

(58) Field of Classification Search ............. 365/185.17, 365/185.33, 185.13, 185.26; 257/316, 103, 257/68

See application file for complete search history.

(56) References Cited

U.S. PATENT DOCUMENTS

| 7,365,018 | B2 * | 4/2008 | Higashitani et al. | 438/717 |
| 7,636,256 | B2 * | 12/2009 | Gomikawa et al. | 365/185.17 |
| 7,671,475 | B2 * | 3/2010 | Kamigaichi et al. | 257/773 |
| 2007/0243680 | A1 * | 10/2007 | Harari et al. | 438/257 |

* cited by examiner

*Primary Examiner* — Pho M Luu (57) ABSTRACT

A NAND flash memory cell string having scaled down select gates. The NAND flash memory cell string includes a first select gate that has a width of 140 nm or less and a plurality of wordlines that are coupled to the first select gate. Gates associated with the plurality of wordlines are formed of p+ polysilicon. A second select gate that has a width of 140 nm or less is coupled to the plurality of wordlines.

17 Claims, 7 Drawing Sheets

Figure 7

SCALED DOWN SELECT GATES OF NAND FLASH MEMORY CELL STRINGS AND METHOD OF FORMING SAME

FIELD OF THE INVENTION

The present invention relates to the fabrication of flash memory cells.

BACKGROUND

Flash memory is non-volatile computer memory that can be electrically erased and reprogrammed. Flash memory is primarily used in memory cards and USB flash drives for general storage and transfer of data between computers and other digital products. Flash memory is a specific type of EEPROM (Electrically Erasable Programmable Read-Only Memory) that is erased and programmed in large blocks. Example applications include storage for PDAs (personal digital assistants), laptop computers, digital audio players, digital cameras and mobile phones. Other applications include game consoles, where flash memory can be used instead of other types of EEPROMs or battery-powered SRAM for game save data.

NAND type flash memory is one of two types of flash memory technologies (the other being NOR) that are currently available. NAND type flash memory is best suited for use in flash devices requiring high capacity data storage. NAND type flash memory provides significantly more storage space, and offers faster erase, write and read capabilities as compared to NOR type flash memory.

Figure 1:
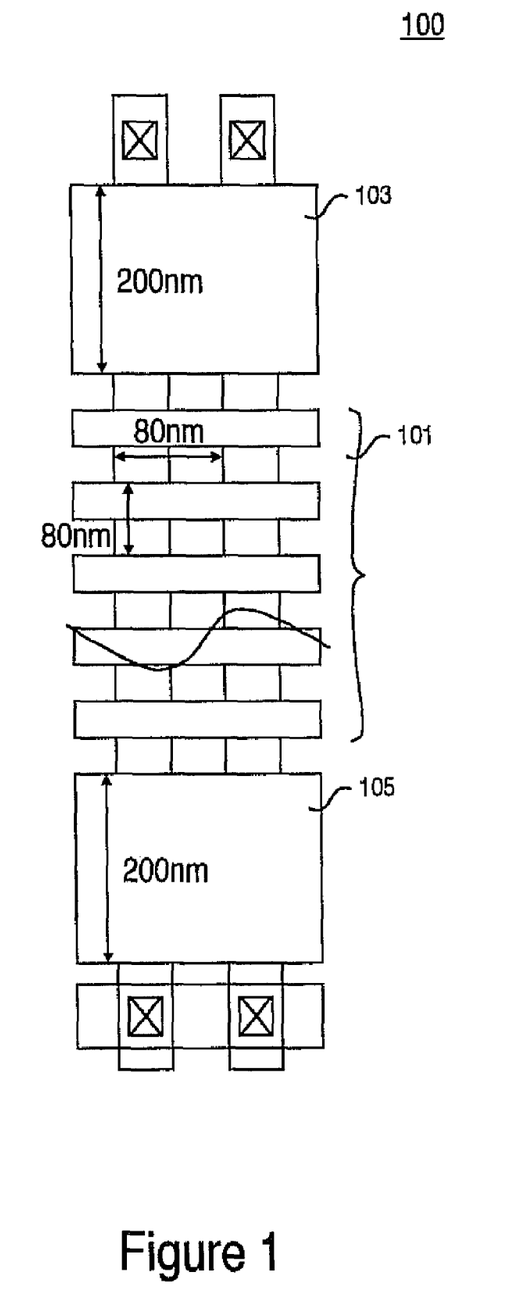
FIG. 1 shows a layout representation of a conventional NAND memory cell string.

FIG. 1 shows a layout representation of a conventional NAND memory cell string 100 that features a conventional select gate structure. In FIG. 1 NAND string 100 has a defined number of wordlines 101 (16, 32, or 64 depending on product design) sandwiched between a "drain select gate" 103 at one end of the string structure and a "source select gate" 105 at the other end of the string structure. As shown in FIG. 1 the distance between a first edge of each wordline and the first edge of the next wordline is 80 nm and the distance between a first edge of each string and a first edge of the next string is 80 nm. Moreover, the width of the select drain gate and the width of select source gate is 200 nm.

Conventional channel engineering design for conventional NAND type memory structures, such as that shown in FIG. 1, provide an obstacle to the scaling down of the sizes of the select gates of such NAND type memory structures. Accordingly, the transistor gate design, including the materials used, of conventional NAND type memory provides an unsatisfactory hindrance to miniaturization efforts for NAND type memory structures.

SUMMARY OF THE INVENTION

A NAND flash memory cell string having scaled down select gates is disclosed. The NAND flash memory cell string includes a first select gate that has a width of 140 nm or less and a plurality of wordlines that are coupled to the first select gate. Gates associated with the plurality of wordlines are formed of n+ polysilicon, p+ polysilicon, or metal material. A second select gate that has a width of 140 nm or less is coupled to the plurality of wordlines.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

NAND Flash Memory Cell Strings with Scaled Down Select Gates

Figure 2:
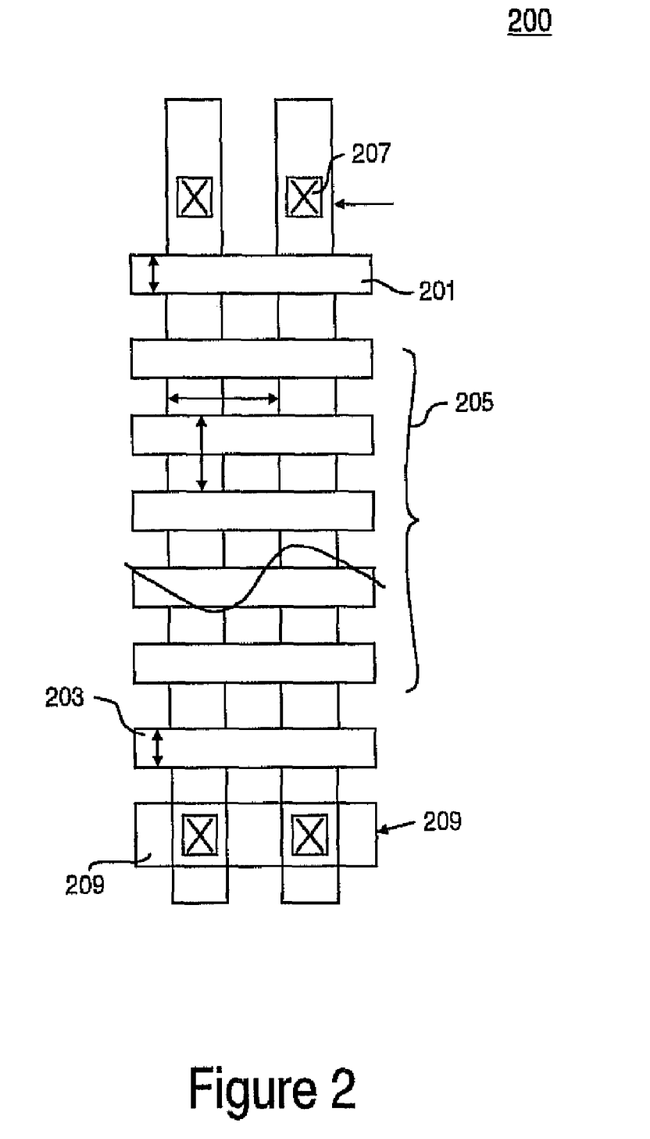
FIG. 2 shows a layout view of a NAND memory cell string according to one embodiment.

FIG. 2 shows a layout view of a NAND memory cell string 200 according to one embodiment. In one embodiment NAND memory cell string 200 features select gates that have a width of 140 nm or less (e.g., 40 nm etc.) and are formed from materials that include but are not limited to polysilicon and metal. In the FIG. 2 embodiment, NAND memory cell string 200 includes select drain gate 201, select source gate 203, wordlines 205, drain contacts 207 and source local interconnection 209.

Referring to FIG. 2, select drain gate 201 is used to facilitate the selection of memory cells in the execution of read, write and erase operations. Select drain gate 201 receives voltages from a coupled bitline that can be passed to selected memory cells of NAND string 200 as a part of read, write and erase operations. In one embodiment, select drain gate 201 is formed to have a width of 140 nm or less (e.g., 40 nm etc.). In one embodiment, select drain gate 201 is formed using materials that can include but are not limited to polysilicon and metal.

Select source gate 203 is used to apply predetermined voltages to source terminals of memory cells to facilitate the execution of read, write and erase operations. Select source gate 203 receives voltages from a coupled common source line that are transferred to selected memory cells of NAND string 200 as a part of read, write and erase operations. In one embodiment, select source gate 203 is formed to have a width of 140 nm or less (e.g., 40 nm etc.). In one embodiment, select source gate 203 is formed using materials that can include but are not limited to polysilicon and metal.

Wordlines 205 facilitate the access of individual NAND memory cells. In one embodiment, 32 wordlines can be used. In another embodiment, another number of wordlines can be used (e.g., 64, 128, etc.). In one embodiment, gates associated with wordlines 205 are formed using materials that can include but are not limited to polysilicon and metal.

Drain contact 207 provides a contact to the drain region of the associated semiconductor structure.

Source local interconnection 209 provides a contact to the source region of the associated semiconductor structure.

Exemplary Select Gate Operation Requirements

Programming

Figure 3A:
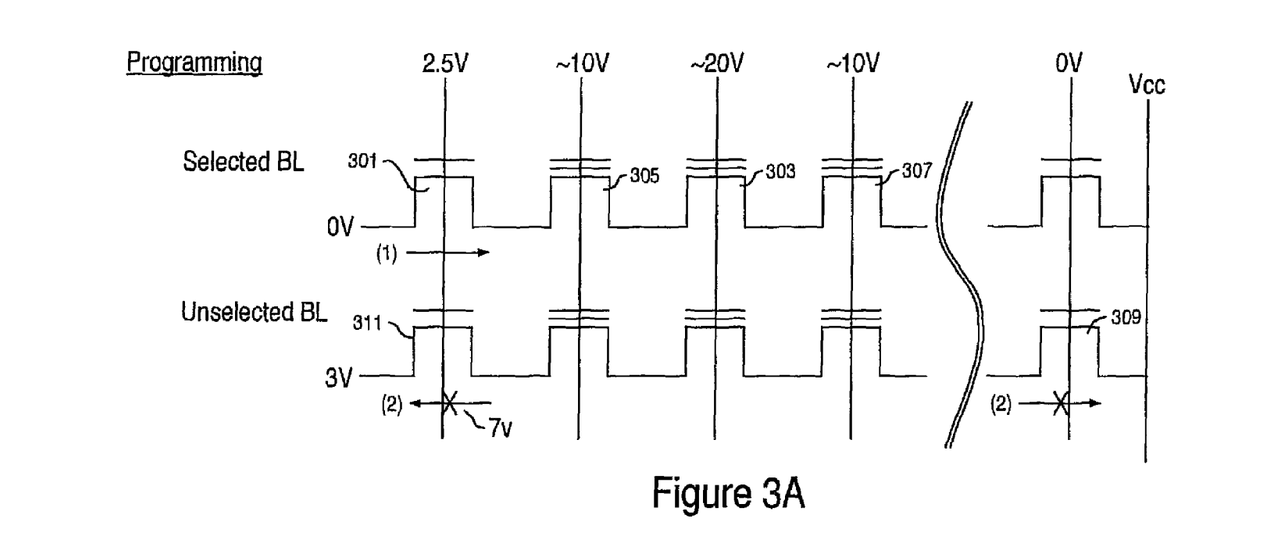
FIG. 3A illustrates select gate operational requirements for programming a memory cell according to one embodiment.
Figure 3B:
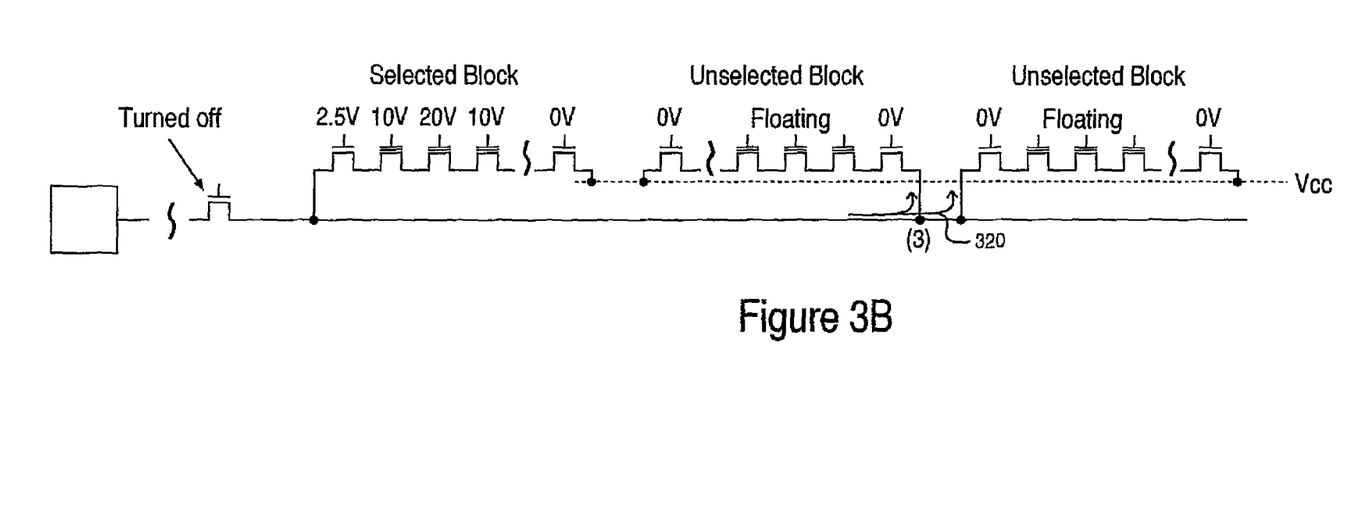
FIG. 3B illustrates programming at the block level according to one embodiment.

FIG. 3A illustrates select gate operation requirements in a process of programming a memory cell according to one embodiment. FIG. 3B illustrates gate operation requirements related to programming at the block level according to one embodiment. These operations are only exemplary. In other embodiments, other operations may be included.

Referring to FIG. 3A, at (1), during programming, the select gate 301 (e.g., drain select gate) is required to pass zero volts to the memory cell string associated with a selected bitline.

At (2), select gates 311 and 309 (e.g., drain and source select gates) are required to tolerate a boosted channel potential coming from the memory cell string associated with the unselected bitline during programming. In other embodiments, select gate 311 and 309 can be required to tolerate other magnitudes of voltage coming from the memory cell string.

At (3), select gates (see FIG. 3B at 320) are required to prevent leakage in unselected blocks so that the bitline inhibit voltage does not drop during programming.

For example, as a part of a data write operation a high voltage of about 20 volts is applied to the control gate of the selected memory cell 303 while an intermediate voltage of about 10 volts is applied to the gate of adjacent memory cells 305 and 307. Zero volts is applied to the selected bitline which is transferred to drain of selected memory cell 303 causing electrons to be injected into the charge trapping layer of selected memory cell 303. This causes the threshold voltage of selected memory cell 303 to be shifted in the positive direction. In one embodiment, this state is representative of a logical "1".

Referring again to FIG. 3A, because of the channel engineering processes and material used to form the herein described select gates in accordance with one embodiment, select gate 301 is able is to be reduced in size and meet the select gate requirement (1) to pass zero volts to the memory cell string associated with the selected bitline. In addition, select gates 311 and 309 are able to be reduced in size and meet the select gate requirement (2) to tolerate a boosted channel potential from the memory cell string associated with the unselected bitline. Moreover, the select gates in unselected blocks are able to be reduced in size and meet the select gate requirement (3) to prevent leakage in unselected blocks so that an inhibit voltage does not drop as shown in the FIG. 3B block level programming view at 320.

Read

Figure 4:
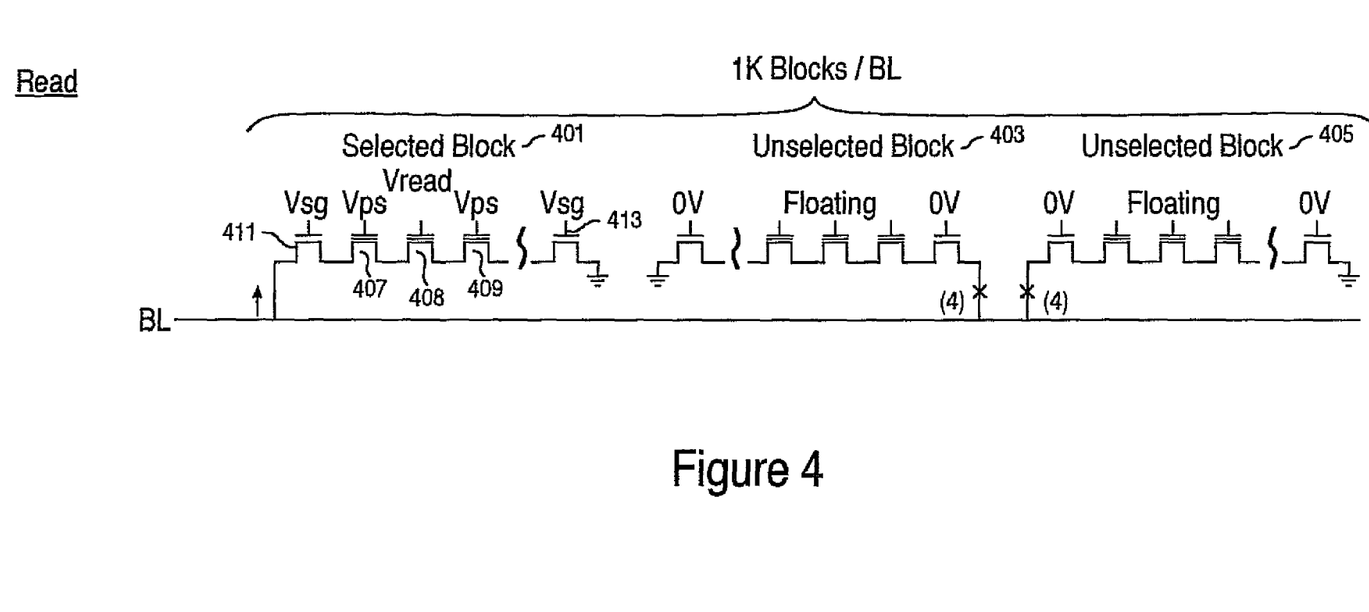
FIG. 4 illustrates select gate operational requirements for reading a memory cell according to one embodiment.

FIG. 4 shows select gate operating requirements for a memory cell reading process according to one embodiment. These operating requirements are only exemplary. In other embodiments, other operation requirements may be included.

Referring to FIG. 4, the select gate is required to prevent leakage in unselected blocks to achieve a high signal to noise (S/N) ratio. In one embodiment, the select gate design and the material used to fabricate the transistors associated therewith provide low leakage current transistors that help to prevent leakage in unselected blocks.

For example, as a part of a data read operation the control gate of a selected memory cell 408 is set to the read voltage. The pass gates and select gates of the remaining memory cells 407 and 409 are set to the power potential with sufficient gate overdrive in the selected block 401 (see FIG. 4). Next, the read operation is completed by determining whether or not current is flowing in selected memory cell 408. In one embodiment, select gates in the unselected blocks 403 and 405 formed using the material and having the dimensions as discussed herein are able to be set to zero volts while preventing leakage in the unselected blocks. As mentioned above, this capability provides a high signal to noise (S/N) ratio.

Figure 5:
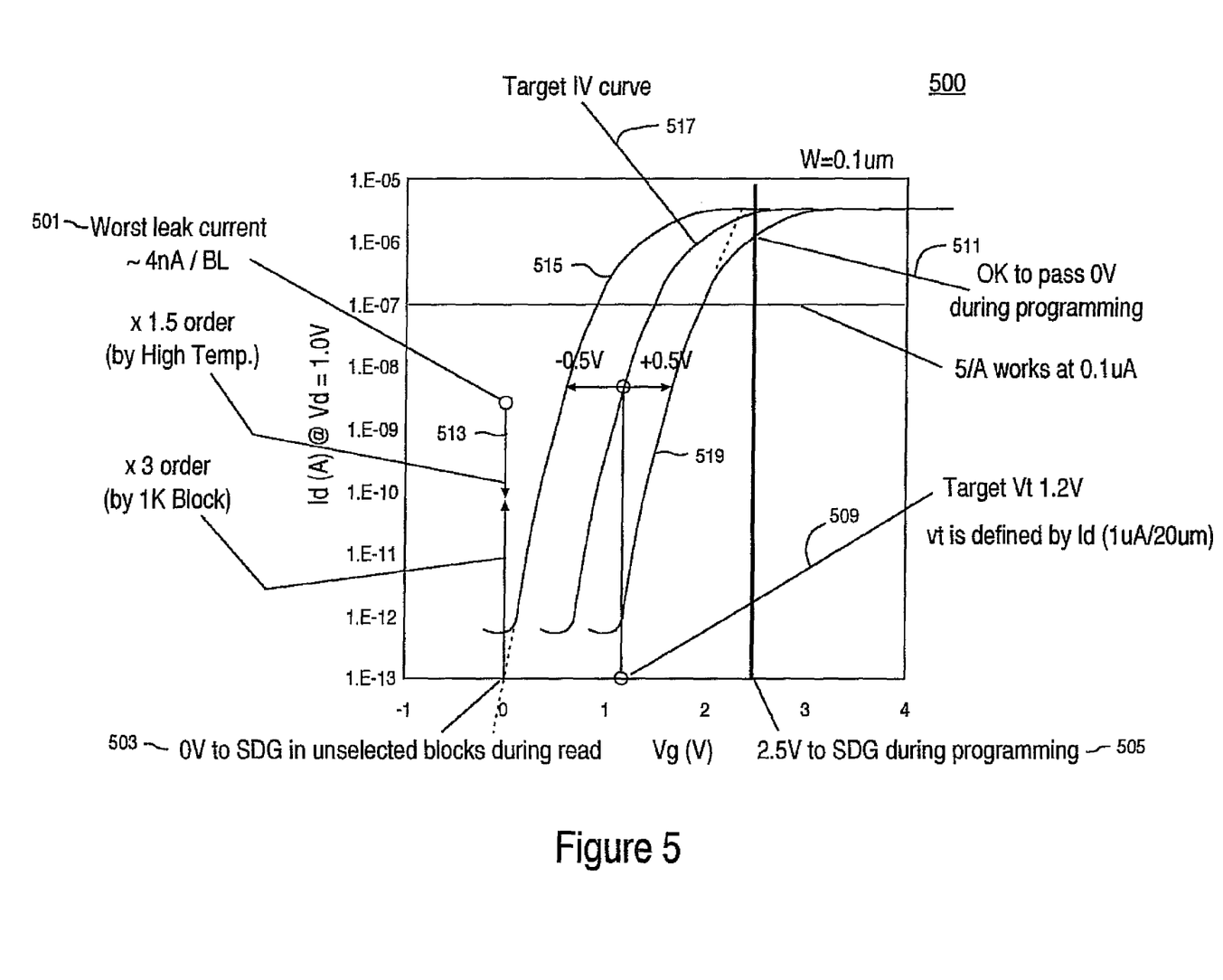
FIG. 5 shows a graph of Id-Vg curves of scaled down select gate devices of a NAND memory cell string according to one embodiment.

FIG. 5 shows a graph 500 of IV curves of scaled down select gates of a NAND memory cell string formed in accordance with one embodiment. Referring to FIG. 5, graph 500 shows parameters such as worst leak current 501, voltage to select drain gate in unselected blocks during read 503, voltage to select drain gate during programming 505, target Vt 509 and pass volts during programming 511. In one embodiment, graph 500 shows that zero volts is applied to unselected blocks 503 during read operations (see also FIG. 4). As discussed above, graph 500 shows that in one embodiment, leakage voltage is prevented in unselected blocks so that the inhibit voltage does not drop (see line 513 in graph 500). The worst leakage current 501 is indicated as lying on line 513 (corresponding to zero volts). As it regards programming operations, graph 500 shows that, in one embodiment, 2.5 volts is applied to the select drain gate during such (see 505 in FIG. 5). Moreover, during programming, graph 500 shows that zero volts is allowed to be passed to the memory cell (see 511 in FIG. 5) that is selected for programming. Referring again to FIG. 5, in one embodiment, as shown in graph 500, target threshold voltage Vt 509 is 1.2 volts which corresponds to target IV curve 517. Also shown in FIG. 5 are IV curves 515 and 519 that respectively correspond to a Vg of less than and greater than the Vg that is associated with target IV curve 517.

Figure 6:
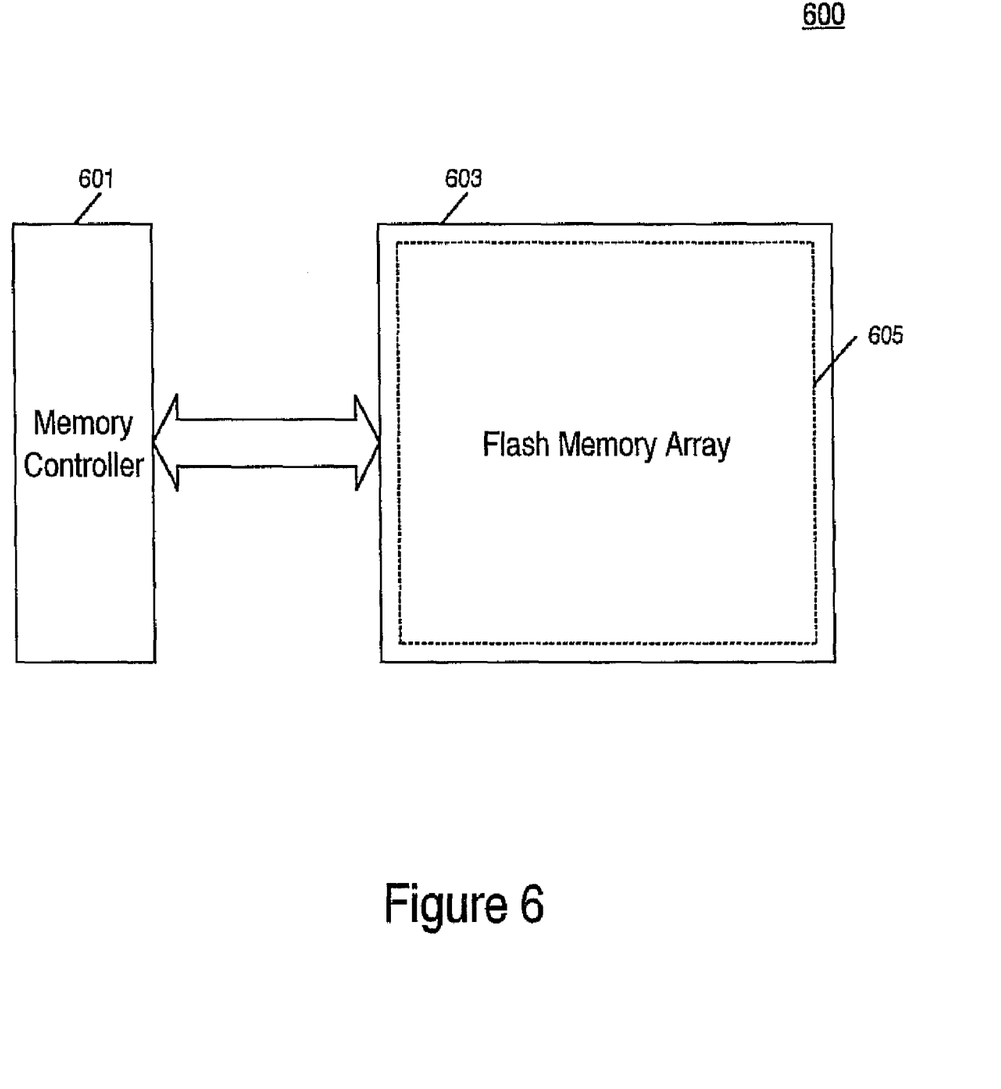
FIG. 6 shows an exemplary operating environment of NAND flash memory cell strings with scaled down select gates formed according to one embodiment.

FIG. 6 shows an exemplary operating environment 600 of a NAND flash memory cell string with scaled down select gates according to one embodiment. FIG. 6 shows memory controller 601 and flash memory array 603 which includes NAND flash memory cell strings with scaled down select gates 605. Referring to FIG. 6 memory controller 601 controls data going to and from flash memory array 603. NAND flash memory cell strings 605 feature scaled down select gate widths of 140 nm or less (e.g., 40 nm etc.) that are formed from a gate material with a high work function that can include but are not limited to p+ polysilicon and metal. In one embodiment, p+ polysilicon gates are used in the NAND memory cell string. It should be appreciated that the scaled down select gates satisfy Vtsat and BVDSS requirements.

Figure 7:
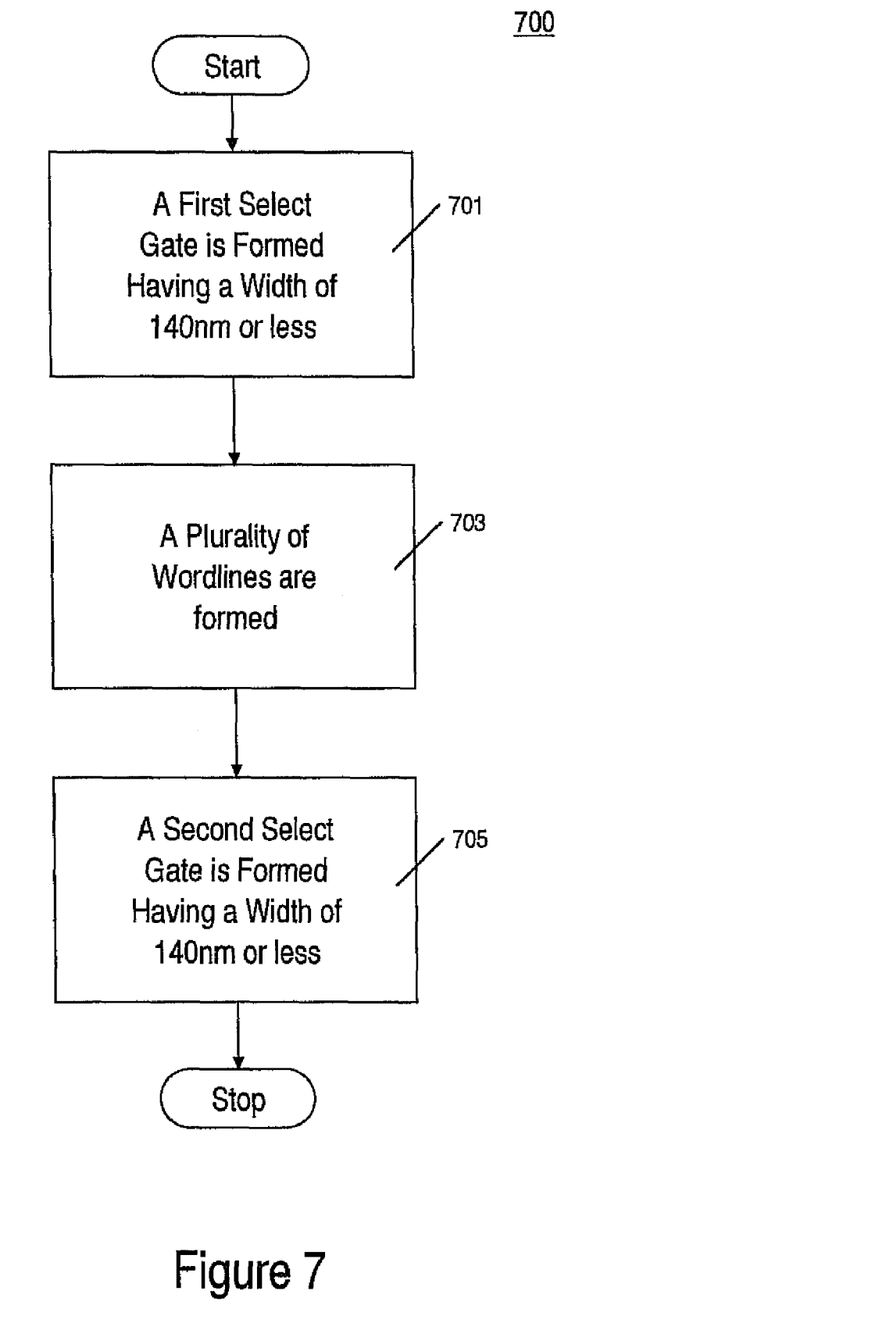
FIG. 7 shows a flowchart of the steps performed in a process for forming a NAND flash memory cell string with scaled down select gates according to one embodiment.

Exemplary Operations for Fabricating NAND Flash Memory with Scaled Down Select Gate FIG. 7 shows a flowchart 700 of the steps performed in a process for forming NAND flash memory with scaled down select gate according to one embodiment. Although specific steps are disclosed in the flowcharts, such steps are exemplary. That is the present invention is well suited to performing various other steps or variations of the steps recited in the flowcharts. Within various embodiments, it should be appreciated that the steps of the flowcharts can be performed by semiconductor fabrication processes.

Referring to FIG. 7, at step 701 a first select gate is formed having a width of 140 nm or less (e.g., 40 nm etc.). In one embodiment, the first select gate is formed using materials that can include but are not limited to polysilicon and metal.

At step 703, a plurality of wordlines are formed to be coupled to said first select gate wherein gates associated with said plurality of wordlines are formed of polysilicon and metal.

At step 705, a second select gate is formed to be coupled to said plurality of wordlines and to have a width of 140 nm or less (e.g., 40 nm etc.). In one embodiment, the second select gate is formed using materials that can include but are not limited to polysilicon and metal.

With reference to exemplary embodiments thereof, a NAND flash memory cell string having scaled down select gates is disclosed. The NAND flash memory string includes a first select gate that has a width of 140 nm or less (e.g., 40 nm etc.) and a plurality of wordlines that are coupled to the first select gate. Gates associated with the plurality of wordlines are formed of p+ polysilicon. A second select gate that has a width of 140 nm or less (e.g., 40 nm etc.) is coupled to the plurality of wordlines.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

We claim:

1. A NAND memory cell string, comprising:
a first select gate having a width of 140 nm or less;
a plurality of wordlines coupled to said first select gate;
a plurality of gates associated with said plurality of wordlines that are formed of p+ polysilicon; and
a second select gate coupled to said plurality of wordlines having a width of 140 nm or less wherein said first and said second select gate tolerates a boosted channel potential coming from said memory cell string during programming.

2. The memory cell string of claim 1 wherein said first and said second select gate passes zero volts to said memory cell string during programming.

3. The memory cell string of claim 1 wherein said first and said second select gate prevents leakage in unselected blocks so that an inhibit voltage does not drop during programming.

4. The memory cell string of claim 1 wherein said first and said second select gate prevents leakage in unselected blocks and affects signal to noise ratio during read operations.

5. The memory cell string of claim 1 wherein said first and said second select gate is formed from a material selected from the group consisting of polysilicon and metal.

6. The string of claim 1 wherein said first select gate and said second select gate have widths of 40 nm or less.

7. A NAND memory device, comprising:
a memory controller;
a memory array comprising;
a plurality of memory cell strings, comprising:
a first select gate having a width of 140 nm or less;
a plurality of wordlines coupled to said first select gate;
a plurality of gates associated with said plurality of wordlines that are formed of p+ polysilicon; and
a second select gate coupled to said plurality of wordlines having a width of 140 nm or less; and
data output circuitry wherein said first and said second select gate tolerates a boosted channel potential coming from a memory cell string associated with an unselected bitline during programming.

8. The memory device of claim 7 wherein said first and said second select gate passes zero volts to a memory cell string associated with a selected bitline during programming.

9. The memory device of claim 7 wherein said first and said second select gate prevents leakage in unselected blocks so that an inhibit voltage does not drop during programming.

10. The memory device of claim 7 wherein said first and said second select gates prevent leakage in unselected blocks that affects signal to noise ratio during read operations.

11. The memory device of claim 7 wherein said first and said second select gate is formed from a material selected from the group consisting of polysilicon and metal.

12. The memory device of claim 7 wherein said first select gate and said second select gate have a width of 40 nm or less.

13. A method for forming a NAND flash memory cell string, comprising:
forming a first select gate having a width of 140 nm or less;
forming a plurality of wordlines coupled to said first select gate;
forming gates that are associated with said plurality of wordlines of p+ polysilicon; and
forming a second select gate coupled to said plurality of wordlines having a width of 140 nm or less wherein said first and said second select gate tolerates seven volts coming from a memory cell string associated with an unselected bitline during programming.

14. The method of claim 13 wherein said first and said second select gate passes zero volts to a memory cell string associated with a selected bitline during programming.

15. The method of claim 13 wherein said first and said second select gate prevents leakage in unselected blocks so that an inhibit voltage does not drop during programming.

16. The method of claim 13 wherein said first and said second select gate prevents leakage in unselected blocks to provide a high signal to noise ratio during read operations.

17. The method of claim 13 wherein said first and said second select gate is formed from a material selected from the group consisting of polysilicon and metal.

* * * * *